(12) United States Patent
Fujii et al.

(10) Patent No.: US 12,388,454 B2
(45) Date of Patent: Aug. 12, 2025

(54) CIRCUIT DEVICE

(71) Applicant: FANUC CORPORATION, Yamanashi (JP)

(72) Inventors: Takahiro Fujii, Yamanashi (JP); Shougo Takahashi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 68 days.

(21) Appl. No.: 18/558,785

(22) PCT Filed: Jul. 30, 2021

(86) PCT No.: PCT/JP2021/028514
§ 371 (c)(1),
(2) Date: Nov. 3, 2023

(87) PCT Pub. No.: WO2023/007752
PCT Pub. Date: Feb. 2, 2023

(65) Prior Publication Data
US 2024/0243749 A1 Jul. 18, 2024

(51) Int. Cl.
*H03M 1/06* (2006.01)

(52) U.S. Cl.
CPC ................. *H03M 1/0607* (2013.01)

(58) Field of Classification Search
CPC ... H03M 1/0607; H03M 1/1295; H03M 1/183
See application file for complete search history.

(56) References Cited

U.S. PATENT DOCUMENTS

| | | | | |
|---|---|---|---|---|
| 2009/0212983 A1* | 8/2009 | Fukuzawa | ........... | H03F 3/45928 341/142 |
| 2009/0315745 A1* | 12/2009 | McLoughlin | ......... | H03M 1/183 341/118 |
| 2010/0110231 A1* | 5/2010 | Funabashi | .............. | H04N 5/185 327/321 |
| 2015/0066159 A1* | 3/2015 | Kubota | ............... | H03M 1/0617 341/118 |

FOREIGN PATENT DOCUMENTS

| JP | S61-065533 A | 4/1986 |
|---|---|---|
| JP | 2000-009792 A | 1/2000 |
| JP | 2002-135118 A | 5/2002 |

(Continued)

OTHER PUBLICATIONS

International Search Report issued in PCT/JP2021/028514; mailed Oct. 12, 2021.

*Primary Examiner* — Omer S Khan
(74) *Attorney, Agent, or Firm* — Studebaker Brackett PLLC

(57) ABSTRACT

Provided is a circuit device that can achieve A/D conversion at a high speed and a high resolution. This circuit device comprises: a gain adjustment circuit that adjusts the gain of an analog output signal outputted from a sensor; an offset adjustment circuit that adjusts the offset voltage of the analog output signal; an A/D converter that converts the analog output signal to a digital signal; and a control unit that sets the gain and the offset voltage of the analog output signal on the basis of the voltage value of a digital signal that was immediately previously converted by the A/D converter.

5 Claims, 6 Drawing Sheets

(56) References Cited

FOREIGN PATENT DOCUMENTS

| | | |
|---|---|---|
| JP | 2003-098002 A | 4/2003 |
| JP | 2012-044347 A | 3/2012 |
| JP | 2014-199181 A | 10/2014 |
| JP | 2019-186626 A | 10/2019 |
| WO | 2013/168284 A1 | 11/2013 |

* cited by examiner

CIRCUIT DEVICE

TECHNICAL FIELD

The present invention relates to a circuit device.

BACKGROUND ART

A circuit device that performs analog-to-digital conversion (hereinafter referred to as A/D conversion) requires an A/D converter having high resolution for a wide measurement range and high-precision measurement (for example, see Patent Document 1). The integrated circuit device described in Patent Document 1 includes an amplifier circuit and an A/D converter that performs A/D conversion on an output signal of the amplifier circuit, and the amplifier circuit is configured by a switched capacitor circuit that cancels an offset voltage of an operational amplifier included in the amplifier circuit.

CITATION LIST

Patent Document

Patent Document 1: Japanese Unexamined Patent Application, Publication No. 2012-44347

DISCLOSURE OF THE INVENTION

Problems to be Solved by the Invention

However, since the A/D converter having high resolution takes a long time for A/D conversion, the analog signal may not be converted into a digital signal within a desired time. Therefore, there is a demand for a circuit device capable of realizing A/D conversion at high speed with high resolution.

Means for Solving the Problems

A circuit device according to an aspect of the present disclosure includes: a gain adjustment circuit that adjusts a gain of an analog output signal outputted from a sensor; an offset adjustment circuit that adjusts an offset voltage of the analog output signal; an A/D converter that converts the analog output signal to a digital signal; and a control unit that sets the gain and the offset voltage of the analog output signal based on a voltage value of the digital signal converted immediately before by the A/D converter.

Effects of the Invention

According to an embodiment of the present invention, it is possible to realize A/D conversion at high speed with high resolution.

PREFERRED MODE FOR CARRYING OUT THE INVENTION

Figure 1:
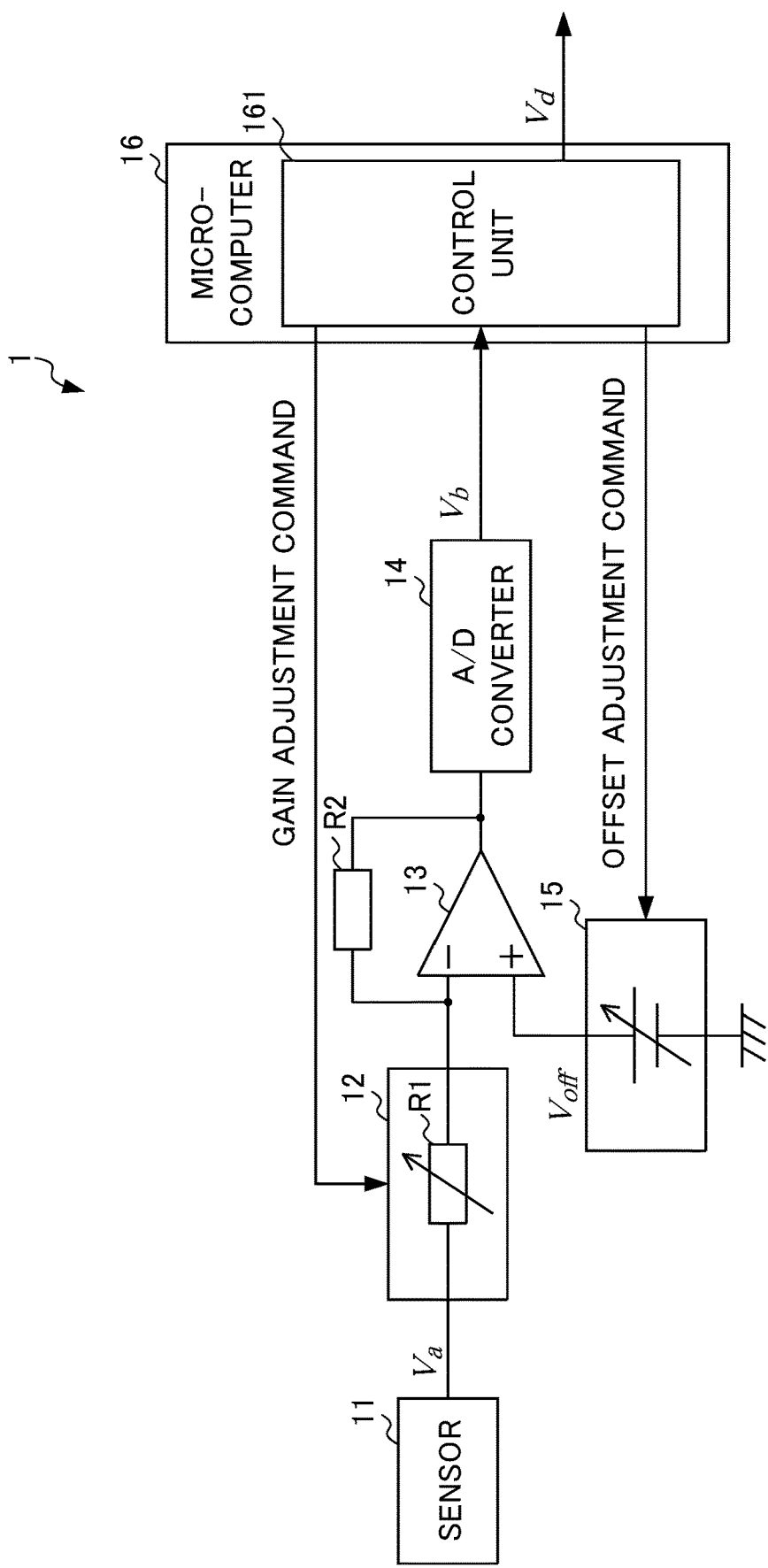
FIG. 1 is a block diagram showing a configuration of a circuit device according to an embodiment of the present embodiment.

Hereinafter, an example of an embodiment of the present invention will be described. FIG. 1 is a block diagram showing the configuration of a circuit device 1 according to the present embodiment. As shown in FIG. 1, the circuit device 1 includes a sensor 11, a gain adjustment circuit 12, an amplifier circuit 13, an A/D converter 14, an offset adjustment circuit 15, and a microcomputer 16.

The sensor 11 includes a temperature sensor, a pressure sensor, a flow rate sensor, and the like, detects any physical quantity, and outputs an analog output signal as a detection result.

The gain adjustment circuit 12 is electrically connected to the sensor 11, a resistor R2, the amplifier circuit 13, and the microcomputer 16. The gain adjustment circuit 12 includes, for example, a digital potentiometer. The gain adjustment circuit 12 adjusts the gain (amplification factor) of the analog output signal outputted from the sensor 11 by changing the resistance value of a variable resistor R1 using a digital potentiometer based on a gain adjustment command from the microcomputer 16. In the present embodiment, the resistance value is uniquely determined with respect to the gain.

The amplifier circuit 13 is electrically connected to the gain adjustment circuit 12, the resistor R2, the A/D converter 14, and the offset adjustment circuit 15. The amplifier circuit 13 adds the offset voltage adjusted by the offset adjustment circuit 15 to the analog output signal adjusted by the gain adjustment circuit 12. The amplifier circuit 13 amplifies the analog output signal obtained by adding the offset voltage. The amplifier circuit 13 outputs the amplified analog output signal to the A/D converter 14. Thus, the variable resistor R1, the resistor R2, and the amplifier circuit 13 constitute an inverting amplifier circuit, and the gain can be determined from the resistance values of the variable resistor R1 and the resistor R2.

The A/D converter 14 is electrically connected to the amplifier circuit 13 and the microcomputer 16. The A/D converter 14 converts (A/D conversion) the analog output signal amplified by the amplifier circuit 13 into a digital signal. The A/D converter 14 outputs the A/D converted digital signal to the microcomputer 16.

The offset adjustment circuit 15 is electrically connected to the amplifier circuit 13 and the microcomputer 16. The offset adjustment circuit 15 includes, for example, a D/A converter, a digital potentiometer, and the like. The offset adjustment circuit 15 adjusts the voltage division by the D/A converter, the digital potentiometer, or the like, thereby adjusting the offset voltage of the analog output signal based on an offset adjustment command from the microcomputer 16.

The microcomputer 16 is electrically connected to the gain adjustment circuit 12, the A/D converter 14, and the offset adjustment circuit 15, and executes various control functions. The microcomputer 16 includes a control unit 161 that controls the gain adjustment circuit 12, the A/D converter 14, and the offset adjustment circuit 15.

The control unit 161 sets the gain of the analog output signal in the gain adjustment circuit 12 and the offset voltage in the offset adjustment circuit 15 based on the voltage value of the digital signal converted immediately before by the A/D converter 14. As described above, the circuit device 1 according to the present embodiment dynamically changes the gain and offset voltage of the analog output signal, and A/D-converts the changed analog output signal, thereby achieving A/D conversion at higher speed and higher resolution than when the gain is fixed. Hereinafter, specific processing of the circuit device 1 according to the first embodiment and the second embodiment will be described.

First Embodiment

Figure 2:
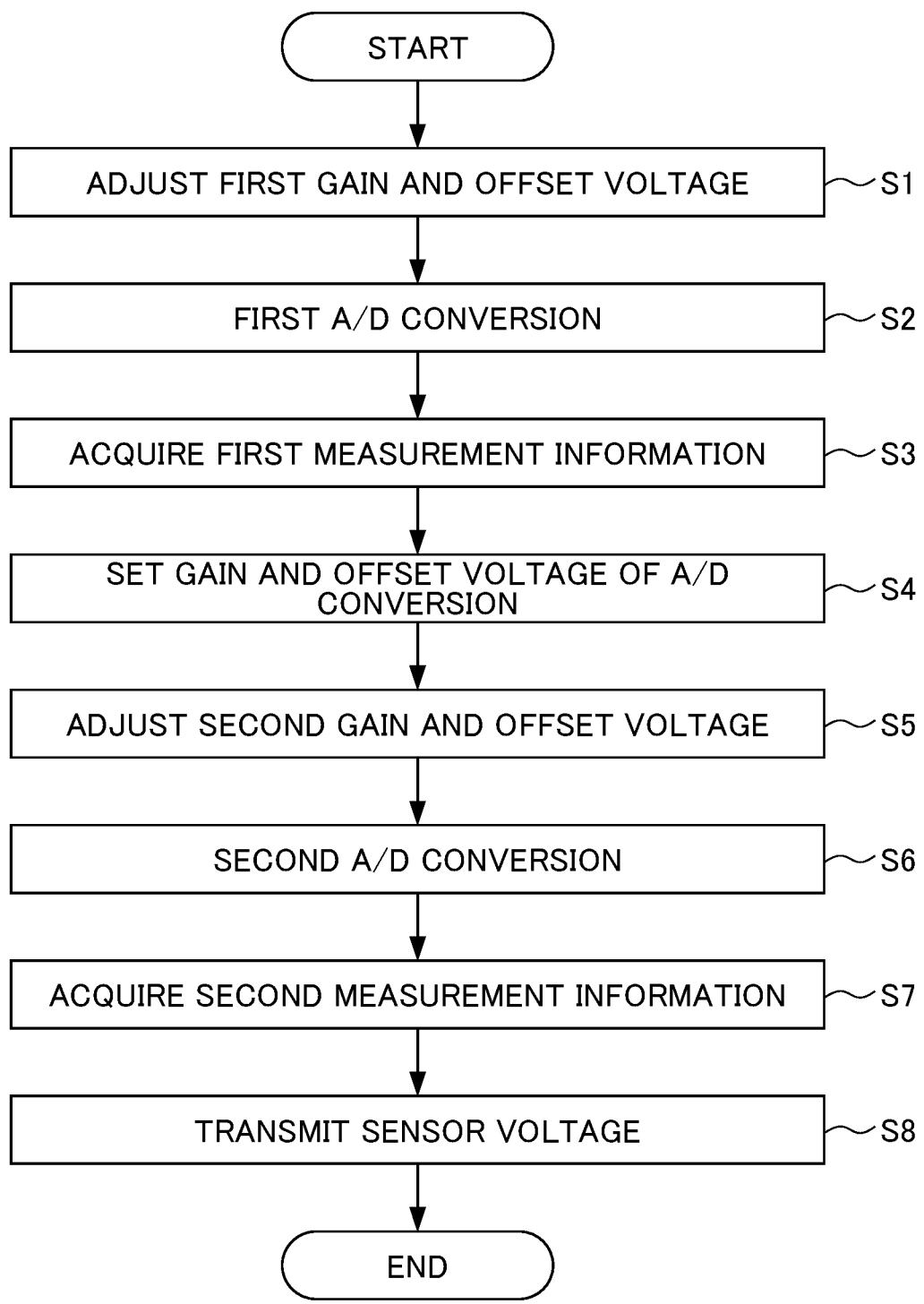
FIG. 2 is a flowchart showing processing of the circuit device according to the first embodiment.

FIG. 2 is a flowchart showing processing of the circuit device 1 according to the first embodiment. In Step S1, the circuit device 1 adjusts the first gain and the offset voltage. Specifically, the control unit 161 outputs a gain adjustment command to the gain adjustment circuit 12 so that the first gain $G_1$ of the analog output signal is set to $G_1=1$.

Further, the control unit 161 outputs an offset adjustment command to the offset adjustment circuit 15 so that the first offset voltage $V_{off1}$ of the analog output signal is set to $V_{off1=voff\_init}$.

Here, when the gain $G_1$ is 1, the resolution in the A/D conversion becomes a minimum, and the measurement range in the A/D conversion becomes a maximum. $V_{off\_init}$ is, for example, a value set at the time of factory shipment.

Then, the sensor 11 outputs the analog output signal $V_a$, and the gain adjustment circuit 12 adjusts the first gain $G_1$ of the analog output signal $V_a$ based on the gain adjustment command. The offset adjustment circuit 15 adjusts the first offset voltage $V_{off1}$ based on the offset adjustment command.

In Step S2, the circuit device 1 performs the first A/D conversion. Specifically, the amplifier circuit 13 adds the first offset voltage $V_{off1}$ adjusted by the offset adjustment circuit 15 to the analog output signal having a gain adjusted by the gain adjustment circuit 12. The amplifier circuit 13 amplifies the analog output signal obtained by adding the first offset voltage $V_{off1}$. The amplifier circuit 13 outputs the amplified analog output signal to the A/D converter 14.

The A/D converter 14 converts the analog output signal amplified by the amplifier circuit 13 into a digital signal. The A/D converter 14 outputs the A/D converted first digital signal $V_{b1}$ to the microcomputer 16. Further, the A/D converter 14 may output information on the occurrence of overflow and/or underflow in the A/D conversion to the microcomputer 16.

In Step S3, the circuit device 1 acquires first measurement information. Specifically, the control unit 161 calculates the first sensor voltage $V_{d1}$ in the first measurement based on the first digital signal $V_{b1}$ outputted from the A/D converter 14. The first sensor voltage $V_{d1}$ is calculated by using the following equation (1).

[Formula 1]

$$V_{d1} = (V_{upper\_lim\_max} - V_{lower\_lim\_min}) \cdot \frac{(V_{b1})_{10}}{2^N} + V_{lower\_lim\_min} \quad (1)$$

Here, $V_{upper\_lim\_max}$ and $V_{lower\_lim\_min}$ are the upper limit value and the lower limit value of the measurement range when the gain is a minimum (in a case where the gain and offset voltage are initial values), respectively, and these values are values which can be known in advance. $V_{b1}$ is a voltage obtained from the A/D converter 14, and $V_{b1}$ is a binary value. N is the number of bits of $V_{b1}$. In equation (1), $(V_{b1})_{10}$ represents a decimal value of $V_{b1}$.

Figure 3:
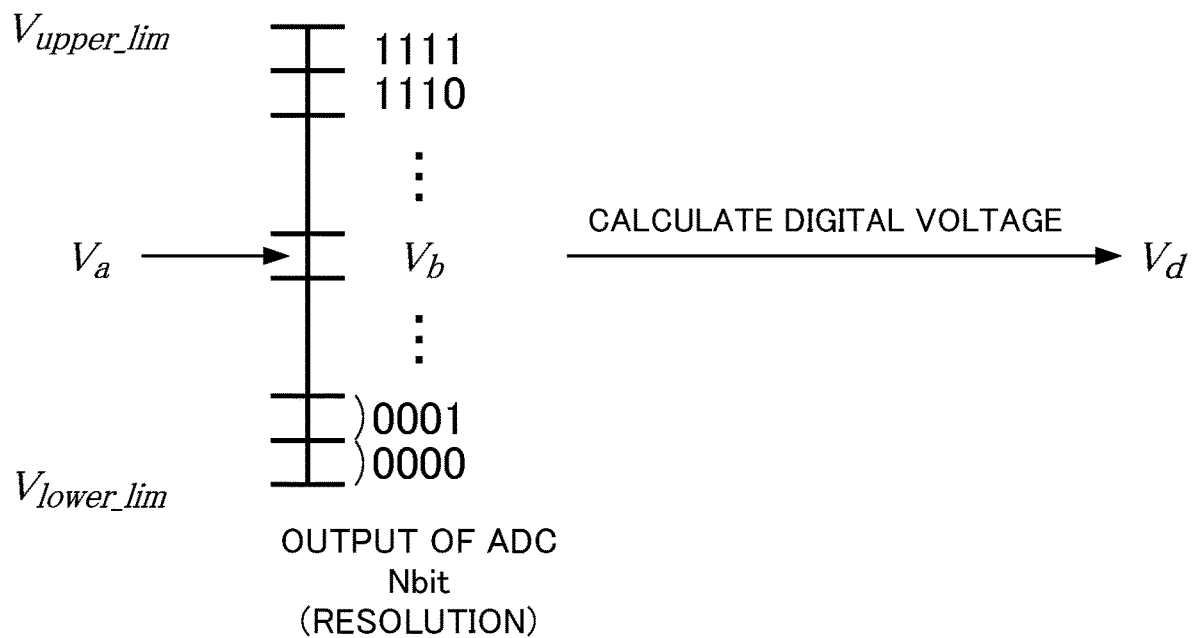
FIG. 3 is a diagram showing processing of converting an analog output signal into a digital signal according to the first embodiment.

FIG. 3 is a diagram showing processing of converting an analog output signal into a digital signal according to the first embodiment. As shown in FIG. 3, the analog output signal $V_a$ is A/D converted by the A/D converter 14, and the first sensor voltage $V_{d1}$ is calculated based on the first digital signal $V_{b1}$ outputted from the A/D converter 14.

Referring back to FIG. 2, in Step S4, the circuit device 1 sets the second gain $G_2$ and the second offset voltage $V_{off2}$ of the A/D conversion. Specifically, the control unit 161 calculates the setting values of the second gain $G_2$ and the second offset $V_{off2}$ in the second measurement based on the first sensor voltage $V_{d1}$, and equations (2) and (3).

$$G_2 = 2^K \quad (2)$$

$$V_{off2} = V_{d1} \quad (3)$$

Equation (2) is a gain setting in a case where the Kbit resolution is higher than the resolution in the first A/D conversion. K is a value determined in advance. Equation (3) sets the second offset voltage $V_{off2}$ to the first sensor voltage $V_{d1}$. In the second measurement, the measurement range is narrowed while the resolution increases. Therefore, only the voltage near the first sensor voltage $V_{d1}$ obtained by the first measurement is measured. Thus, when the original resolution of the A/D converter 14 is N bits, the resolution of the obtained measurement value is N+K bits.

Figure 4:
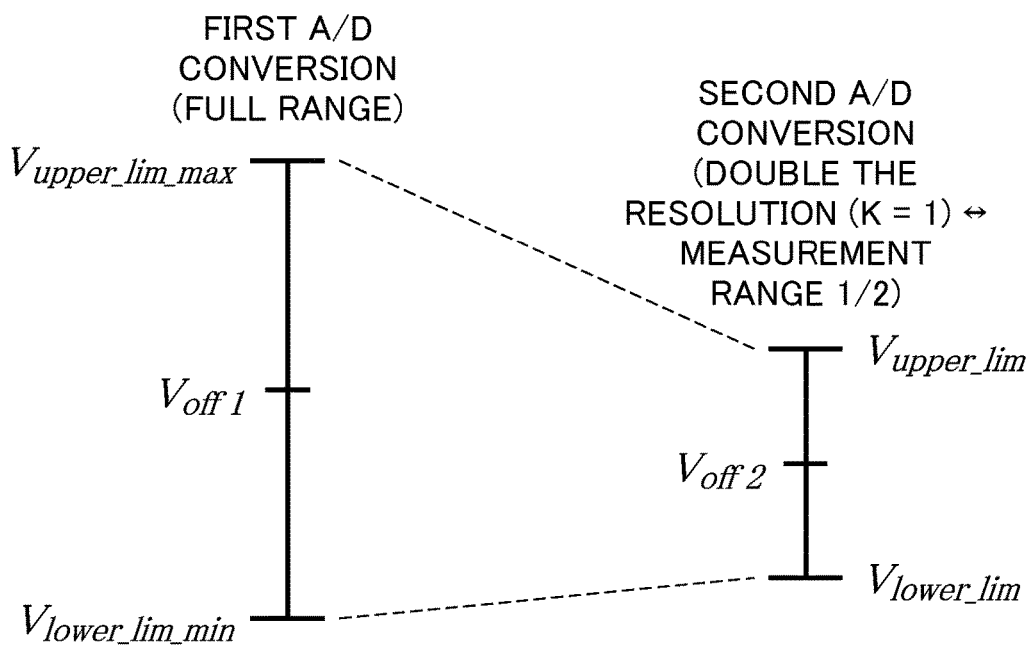
FIG. 4 is a diagram showing a definition of a gain according to the first embodiment.

FIG. 4 is a diagram showing a definition of a gain according to the first embodiment. As shown in FIG. 4, the gain G is defined as follows.

$$G \cdot (V_{upper\_lim} - V_{lower\_lim}) = \Delta V_{ma}( = \text{constant})$$

As shown in FIG. 4, in the first A/D conversion, the gain is set to $G_1=1$, and the measurement range is the maximum measurable range (full range) of the A/D converter 14. In the second A/D conversion, in a case of K=1 in expression (2), the gain is set to $G_2=2$, the resolution is higher than the resolution in the first A/D conversion, and the measurement range is ½ of the measurement range in the first A/D conversion.

Referring back to FIG. 2, in Step S5, the circuit device 1 performs second adjustment of the second gain $G_2$ and the second offset voltage $V_{off2}$. Specifically, the control unit 161 outputs a gain adjustment command to the gain adjustment circuit 12, and the gain adjustment circuit 12 adjusts the second gain $G_2$ of the analog output signal to $G_2=2^K$ based on the gain adjustment command. Further, the control unit 161 outputs an offset adjustment command to the offset adjustment circuit 15, and the offset adjustment circuit 15 adjusts the second offset voltage $V_{off2}$ of the analog output signal to $V_{off2}=V_{d1}$ based on the offset adjustment command.

In Step S6, the circuit device 1 performs the second A/D conversion. Specifically, the amplifier circuit 13 adds the second offset voltage $V_{off2}$ adjusted by the offset adjustment circuit 15 to the analog output signal adjusted to the second gain $G_2$ by the gain adjustment circuit 12. The amplifier circuit 13 amplifies the analog output signal obtained by adding the second offset voltage $V_{off2}$. The amplifier circuit 13 outputs the amplified analog output signal to the A/D converter 14.

The A/D converter 14 converts the analog output signal amplified by the amplifier circuit 13 into a second digital signal $V_{b2}$. The A/D converter 14 outputs the A/D converted second digital signal $V_{b2}$ to the microcomputer 16. The A/D converter 14 outputs information on the occurrence of overflow and/or underflow in the A/D conversion to the microcomputer 16.

In Step S7, the circuit device 1 acquires the second measurement information. Specifically, in Step S6, the control unit 161 calculates the second sensor voltage $V_{d2}$ in the second measurement based on the second digital signal $V_{b2}$ outputted from the A/D converter 14. The second sensor voltage $V_{d2}$ is calculated by using the following equations (4) to (6). In equation (4), $(V_{b2})_{10}$ represents a decimal value of $V_{b1}$.

[Formula 2]

$$V_{d2} = (V_{upper\_lim} - V_{lower\_lim}) \cdot \frac{(V_{b2})_{10}}{2^N} + V_{lower\_lim} \quad (4)$$

$$V_{upper\_lim} = V_{off2} + \frac{V_{upper\_lim\_max} - V_{lower\_lim\_min}}{2 \cdot G_2} \quad (5)$$

$$V_{lower\_lim} = V_{off2} - \frac{-V_{upper\_lim\_max} - V_{lower\_lim\_min}}{2 \cdot G_2} \quad (6)$$

Here, $V_{upper\_lim}$ and $V_{lower\_lim}$ are the maximum value and the minimum value of the measurement range in the second A/D conversion, respectively. $V_{upper\_lim}$ is calculated using Equation (5), and $V_{lower\_lim}$ is calculated using Equation (6). As described above, $V_{upper\_lim}$ and $V_{lower\_lim}$ are calculated based on gain $G_2$ and offset $V_{off2}$ in the second measurement.

In Step S8, the control unit 161 transmits the second sensor voltage $V_{d2}$ calculated in Step S7, the gain and offset voltage set in the A/D conversion, and information on the occurrence of overflow and/or underflow in the A/D conversion to the host system.

As described above, according to the first embodiment, the control unit 161 sets the first gain $G_1$ and the first offset voltage $V_{off1}$ of the analog output signal so that the measurement range of the A/D converter 14 matches the voltage range of the analog output signal, and the A/D converter 14 converts the analog output signal adjusted by the first gain $G_1$ and the first offset voltage $V_{off1}$ into a digital signal.

Then, the control unit 161 calculates the first sensor voltage $V_{d1}$ based on the first digital signal $V_{b1}$ converted by the A/D converter, sets the second offset voltage $V_{off2}$ of the analog output signal in the offset adjustment circuit 15 based on the first sensor voltage $V_{d1}$, and sets the second gain $G_2$ of the analog output signal in the gain adjustment circuit 12 to a value larger than the first gain $G_1$. The A/D converter 14 converts an analog output signal adjusted by the second gain $G_2$ and the second offset voltage $V_{off2}$ into a digital signal.

Thus, the circuit device 1 according to the first embodiment converts the analog output signal into a digital signal in the maximum measurement range of the A/D converter 14 in the first A/D conversion by setting the first gain $G_1$ and the first offset voltage $V_{off1}$. By setting the second gain $G_2$ and the second offset voltage $V_{off2}$, the circuit device 1 narrows the measurement range of the A/D converter 14 and converts the analog output signal into a digital signal with high resolution in the second A/D conversion.

Therefore, since the circuit device 1 can increase the resolution of the A/D converter 14 and narrow the measurement range in the second A/D conversion, for example, the circuit device 1 can perform A/D conversion over a wide range and high resolution at high speed by using the A/D converter 14 with low resolution and high speed.

The control unit 161 further calculates the second sensor voltage $V_{d2}$ based on the second digital signal $V_{b2}$ converted by the A/D converter 14 and the upper limit value $V_{upper\_lim}$ and the lower limit value $V_{lower\_lim}$ of the measurement range in the A/D converter 14, and transmits the calculated second sensor voltage $V_{d2}$ to the host device. Thus, the circuit device 1 can calculate the second sensor voltage $V_{d2}$ from the second digital signal $V_{b2}$ obtained by A/D conversion over a wide range and high resolution, and transmit the second sensor voltage $V_{d2}$ to the host device. Therefore, the circuit device 1 can transmit the second sensor voltage $V_{d2}$ measured with high accuracy to the host device.

Second Embodiment

Figure 5:
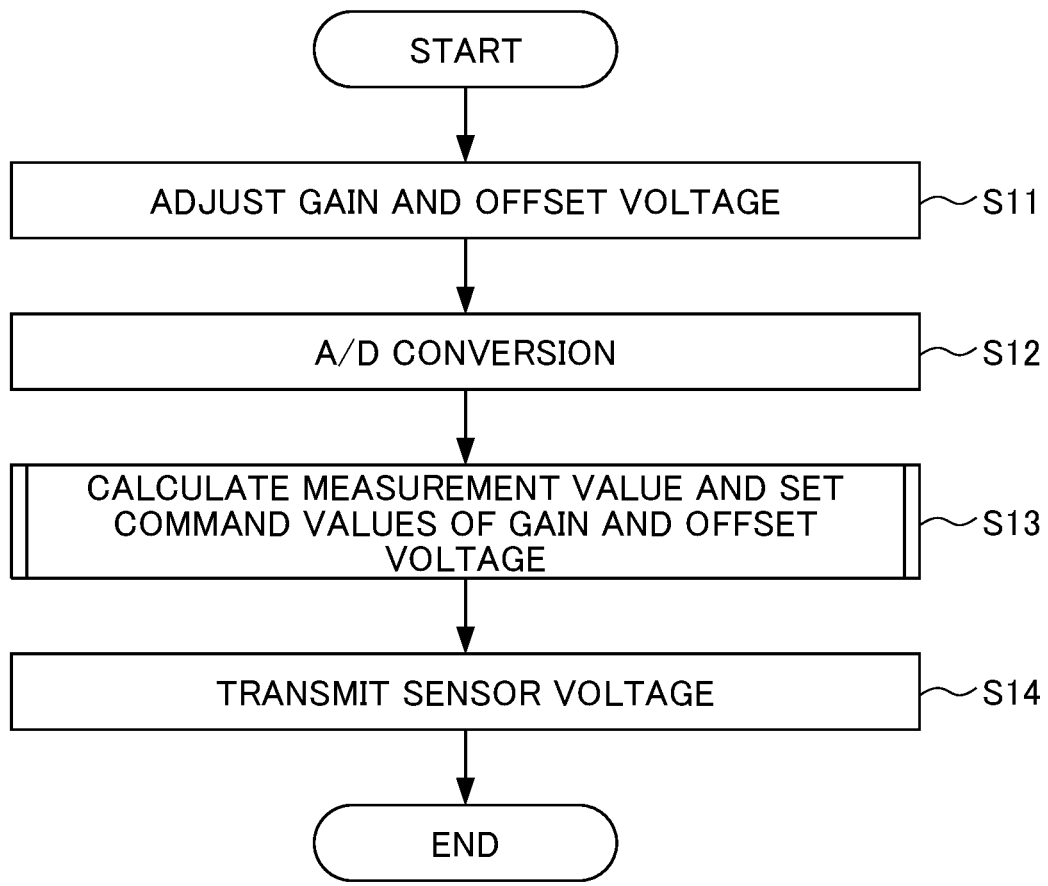
FIG. 5 is a flowchart showing processing of a circuit device according to a second embodiment.

FIG. 5 is a flowchart showing processing of the circuit device 1 according to a second embodiment. The circuit device 1 according to the second embodiment has the same configuration as the circuit device shown in FIG. 1, but differs from the circuit device 1 according to the first embodiment in processing contents. Specifically, the circuit device 1 according to the second embodiment sets a wide measurement range in the A/D conversion when the amount of change in the sensor voltage outputted from the A/D converter 14 is large, and sets a narrow measurement range in the A/D conversion when the amount of change in the sensor voltage outputted from the A/D converter 14 is small.

In Step S11, the circuit device 1 adjusts the gain and offset voltage. Specifically, the control unit 161 outputs a gain adjustment command to the gain adjustment circuit 12, and the gain adjustment circuit 12 adjusts the gain $G_1$ of the analog output signal based on the gain adjustment command.

Further, the control unit 161 outputs an offset adjustment command to the offset adjustment circuit 15, and the offset adjustment circuit 15 adjusts the offset voltage $V_{off1}$ of the analog output signal based on the offset adjustment command. Here, the gain G and the offset voltage $V_{off}$ are adjusted to the gain and the offset voltage used in the previous measurement (for example, processing corresponding to the processing of Step S4 in FIG. 2).

In Step S12, the circuit device 1 performs A/D conversion. Specifically, the sensor 11 outputs the analog output signal $V_a$, and the gain adjustment circuit 12 adjusts the gain of the analog output signal $V_a$ based on the gain adjustment command. The amplifier circuit 13 adds the offset voltage adjusted by the offset adjustment circuit 15 to the analog output signal adjusted by the gain adjustment circuit 12. The amplifier circuit 13 amplifies the analog output signal obtained by adding the offset voltage. The amplifier circuit 13 outputs the amplified analog output signal to the A/D converter 14.

The A/D converter 14 converts the analog output signal amplified by the amplifier circuit 13 into a digital signal. The A/D converter 14 outputs the A/D converted digital signal $V_{b2}$ to the microcomputer 16. Further, the A/D converter 14 outputs information on the occurrence of overflow and/or underflow in the A/D conversion to the microcomputer 16 together with the digital signal $V_b$.

In Step S13, the circuit device 1 performs calculation of a measured value and sets gain and offset command values.

Specifically, the control unit 161 calculates the sensor voltage $V_d$, the gain $G_{next}$, and the offset voltage $V_{off\_next}$ at the time of the next A/D conversion based on the digital signal $V_b$(binary number) output from the A/D converter 14.

Figure 6:
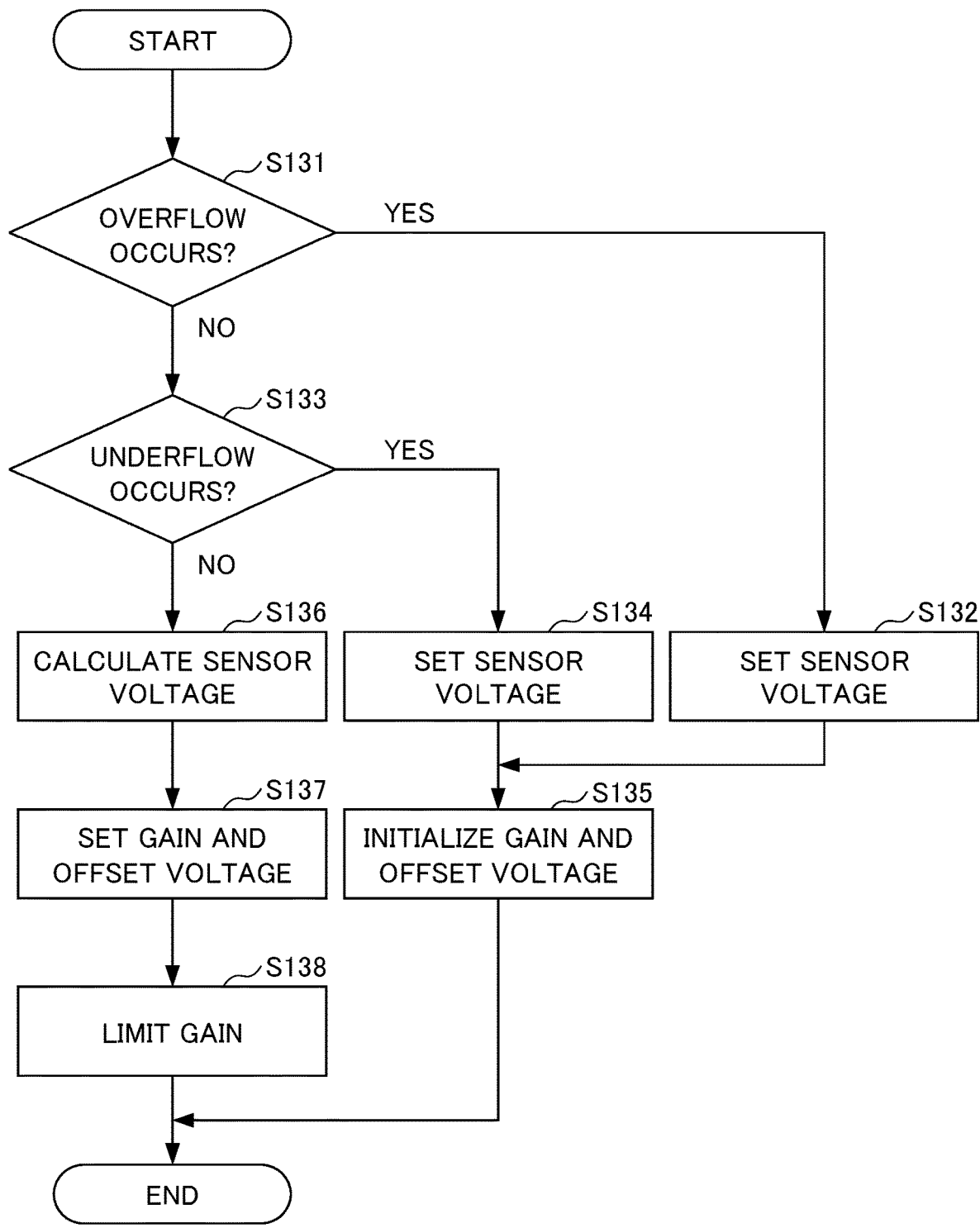
FIG. 6 is a flowchart showing processing of calculation of a measured value and setting of gain and offset command values according to the second embodiment.

The processing of Step S13 will be described in detail with reference to FIG. 6. FIG. 6 is a flowchart showing calculation of a measured value and setting of gain and offset command values according to the second embodiment.

In Step S131, the control unit 161 determines whether an overflow has occurred in the A/D conversion. When the overflow occurs (YES), the processing advances to Step S132. On the other hand, when no overflow occurs (NO), the processing advances to Step S133.

In Step S132, the control unit 161 sets the upper limit voltage $V_{upper\_lim}$ of the measurement range as the sensor voltage $V_d$ as shown in the following Equation (11).

$$V_d = V_{upper\_lim} \quad (11)$$

In Step S133, the control unit 161 determines whether or not underflow has occurred in the A/D conversion. When underflow has occurred (YES), the processing advances to Step S134. On the other hand, when underflow has not occurred (NO), the processing advances to Step S136.

In Step S134, the control unit 161 sets the lower limit voltage $V_{lower\_lim}$ of the measurement range as the sensor voltage $V_d$ as shown in the following Equation (12).

$$V_d = V_{lower\_lim} \quad (12)$$

In Step S135, the control unit 161 calculates the setting values of the gain and offset voltage in the next A/D conversion. When overflow or underflow occurs in the current A/D conversion, the control unit 161 sets the gain $G_{next}$ and the offset voltage $V_{off\_next}$ to initial values for the next A/D conversion, as shown in the following Equations (13) and (14).

$$G_{next} = 1 \quad (13)$$

$$V_{off\_next} = V_{off\_init} \quad (14)$$

In Step S136, the control unit 161 calculates the sensor voltage $V_d$ based on the digital signal $V_b$ (binary number) outputted from the A/D converter 14 and the following Equations (15), (16) and (17). In Equation (15), $(V_b)_{10}$ represents a decimal value of $V_b$.

[Formula 3]

$$V_d = \frac{(V_b)_{10}}{2^N} \cdot (V_{upper\_lim} - V_{lower\_lim}) + V_{lower\_lim} \quad (15)$$

$$V_{upper\_lim} = V_{off} + \frac{V_{upper\_lim\_max} - V_{lower\_lim\_min}}{2 \cdot G} \quad (16)$$

$$V_{lower\_lim} = V_{off} - \frac{V_{upper\_lim\_max} - V_{lower\_lim\_min}}{2 \cdot G} \quad (17)$$

In Step S137, the control unit 161 calculates the setting values of the gain and offset voltage in the next A/D conversion. The control unit 161 calculates the gain $G_{next}$ using the following Equation (18).

[Formula 4]

$$G_{next} = \begin{cases} G \times 2 & \text{if } \left|\frac{V_d - V_{d-1}}{V_{upper\_lim} - V_{lower\_lim}}\right| < \alpha \\ G/2 & \text{else if } \left|\frac{V_d - V_{d-1}}{V_{upper\_lim} - V_{lower\_lim}}\right| > \beta \\ G & \text{else} \end{cases} \quad (18)$$

That is, the control unit 161 compares the sensor voltage $V_{d-1}$ in the previous A/D conversion with the sensor voltage $V_d$ in the current A/D conversion. When the amount of change between the sensor voltage $V_{d-1}$ and the sensor voltage $V_d$ is less than a threshold value $\alpha$, the control unit 161 sets the gain $G_{next}$ to a value larger than the previous gain in order to increase the resolution.

On the other hand, when the amount of change between the sensor voltage $V_{d-1}$ and the sensor voltage $V_d$ exceeds a threshold value $\beta$, the control unit 161 sets the gain $G_{next}$ to a value smaller than the previous gain in order to widen the measurement range. When the amount of change is equal to or greater than the threshold value $\alpha$ or equal to or less than the threshold value $\beta$, the control unit 161 maintains the value of the gain $G_{next}$ at the previous value, i.e., does not change the value of the gain $G_{next}$. In Equation (18), the coefficients (2 and ½) multiplied by the gain are any values and are not limited to the above values.

Further, the control unit 161 calculates the offset voltage $V_{off\_next}$ using the following Equation (19).

$$V_{off\_next} = V_d (V_d - V_{d-1}) \quad \text{Equation (19)}$$

That is, the offset voltage $V_{off\_next}$ is a value obtained by adding the difference between the previous sensor voltage $V_{d-1}$ and the current sensor voltage $V_d$ to the current sensor voltage $V_d$. Thus, when the amount of change of the sensor voltage is constant, the sensor voltage is set to be the center of the measurement range.

In Step S138, the control unit 161 determines whether or not the gain $G_{next}$ calculated in Step S137 is within a predetermined range. When the gain $G_{next}$ is not within the predetermined range, the control unit 161 sets the gain $G_{next}$ to the upper limit value ($G_{next}=G_{max}$) or the lower limit value ($G_{next}=1$) of the gain using the following Equation (20).

[Formula 5]

$$G_{next} = \begin{cases} G_{max} & \text{if } G_{next} > G_{max} \\ 1 & \text{if } G_{next} < 1 \end{cases} \quad (20)$$

Referring back to FIG. 5, in Step S14, the control unit 161 transmits the sensor voltage $V_d$ calculated in Step S132, Step S134, or Step S136, the gain and offset voltage set at the time of A/D conversion, and information on the occurrence of overflow and/or underflow in A/D conversion to the host system.

Further, the control unit 161 stores the sensor voltage $V_d$ and the gain and offset voltage set at the time of A/D conversion in the storage area of the microcomputer 16 in order to use them for subsequent measurements.

Figure 7:
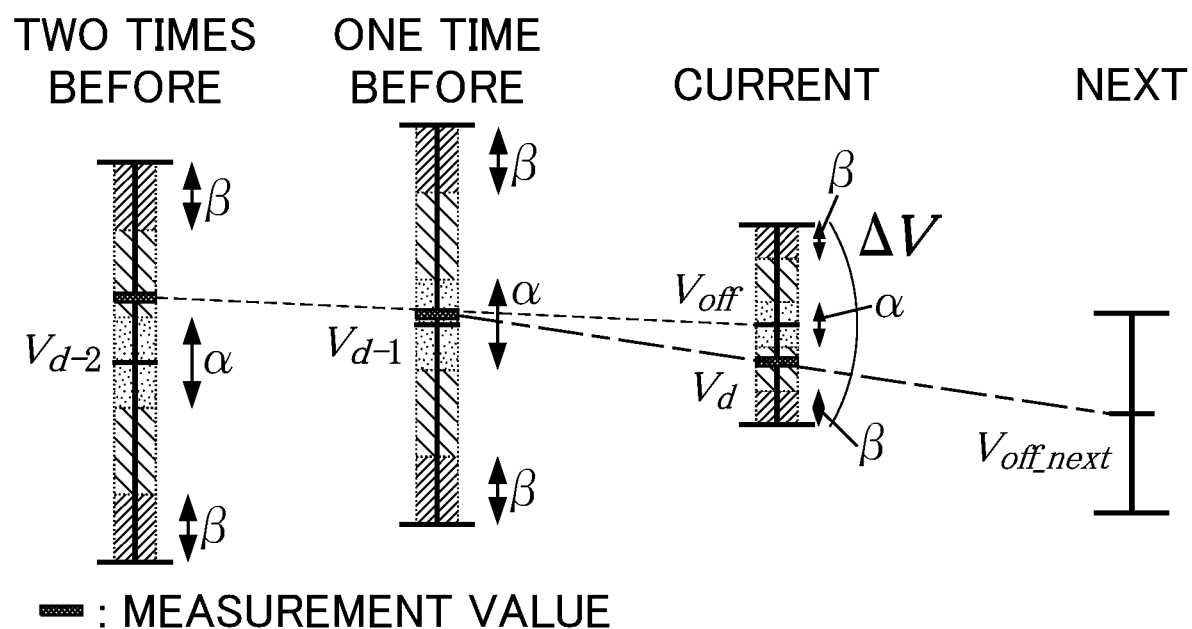
FIG. 7 is a diagram showing a relationship between an amount of change of a voltage value of a digital signal and setting of a gain and an offset voltage according to the second embodiment.

FIG. 7 is a diagram showing a relationship between an amount of change in a voltage value of a digital signal and setting of a gain and an offset voltage according to the second embodiment.

As shown in FIG. 7, when the amount of change is less than the threshold value α, the control unit 161 sets the gain $G_{next}$ to a value larger than the previous gain. When the amount of change exceeds the threshold value β, the control unit 161 sets the gain $G_{next}$ to a value smaller than the previous gain in order to widen the measurement range.

When the amount of change is equal to or greater than the threshold value α or equal to or less than the threshold value β, the control unit 161 maintains the value of the gain $G_{next}$ at the previous value, i.e., does not change the value of the gain $G_{next}$. The offset voltage $V_{off\_next}$ is a value obtained by adding the difference between the previous sensor voltage $V_{d-1}$ and the current sensor voltage $V_d$ to the current sensor voltage $V_d$.

As described above, according to the second embodiment, the control unit 161 compares the sensor voltage $V_{d-1}$ based on the digital signal obtained by the previous A/D conversion with the sensor voltage $V_d$ based on the digital signal obtained by the current A/D conversion, and when the amount of change from the sensor voltage $V_{d-1}$ to the sensor voltage $V_d$ is less than the threshold value α, sets the gain $G_{next}$ of the analog output signal to a value larger than the gain of the previous time, and when the amount of change exceeds the threshold value β, sets the gain $G_{next}$ of the analog output signal to a value smaller than the gain of the previous time.

With such a configuration, in the circuit device 1 according to the second embodiment, when the amount of change in the sensor voltage is less than the threshold value α, it is possible to increase the resolution by setting the gain to a value larger than the gain of the previous time. On the other hand, in the circuit device 1, when the amount of change in the sensor voltage exceeds the threshold value β, it is possible to narrow the resolution by setting the gain to a value smaller than the gain of the previous time. Accordingly, it is possible for the circuit device 1 to set the resolution according to the amount of change in the sensor voltage, and perform A/D conversion in a wide range and high resolution at high speed.

The control unit 161 sets the offset voltage $V_{off\_next}$ of the analog output signal based on the sensor voltage $V_{d-1}$ based on the digital signal obtained by the previous A/D conversion and the sensor voltage $V_d$ based on the digital signal obtained by the current A/D conversion. With such a configuration, it is possible for the circuit device 1 to set the sensor voltage to be the center of the measurement range when the amount of change of the sensor voltage is constant.

Further, the A/D converter 14 outputs information on the occurrence of overflow and/or underflow in the A/D conversion together with the digital signal to the control unit 161. The control unit 161 calculates the sensor voltage $V_d$ as the upper limit of the measurement range of the A/D converter 14 when overflow occurs in the A/D conversion, calculates the sensor voltage $V_d$ as the lower limit of the measurement range of the A/D converter 14 when underflow occurs in the A/D conversion, and sets the gain and offset voltage in the next A/D conversion to the initial values when overflow or underflow occurs in the A/D conversion. With such a configuration, even when overflow and/or underflow occurs, it is possible for the circuit device 1 to set the sensor voltage, the gain, and the offset voltage to appropriate values.

Although the above-described embodiments are preferred embodiments of the present invention, the scope of the present invention is not to be limited to the above-described embodiments, and various modifications can be made without departing from the gist of the present invention.

EXPLANATION OF REFERENCE NUMERALS 1 circuit device
11 sensor
12 gain adjustment circuit
13 amplifier circuit
14 A/D converter
15 offset adjustment circuit
16 microcomputer
161 control unit

The invention claimed is:

1. A circuit device comprising:
a gain adjustment circuit that adjusts a gain of an analog output signal outputted from a sensor;
an offset adjustment circuit that adjusts an offset voltage of the analog output signal;
an A/D converter that converts the analog output signal to a digital signal; and
a control unit that sets the gain and the offset voltage of the analog output signal based on a voltage value of the digital signal converted immediately before by the A/D converter, wherein
the control unit sets a first gain and a first offset voltage of the analog output signal so that a measurement range of the A/D converter matches a voltage range of the analog output signal, and
the control unit calculates a first sensor voltage based on a first digital signal converted by the A/D converter, sets a second offset voltage of the analog output signal in the offset adjustment circuit based on the first sensor voltage, and sets a second gain of the analog output signal in the gain adjustment circuit to a value larger than the first gain.

2. The circuit device according to claim 1, wherein the control unit further calculates a second sensor voltage based on a second digital signal converted by the A/D converter, and an upper limit value and a lower limit value for the measurement range in the A/D converter, and transmits the calculated second sensor voltage to a host device.

3. A circuit device comprising:
a gain adjustment circuit that adjusts a gain of an analog output signal outputted from a sensor;
an offset adjustment circuit that adjusts an offset voltage of the analog output signal;
an A/D converter that converts the analog output signal to a digital signal; and
a control unit that sets the gain and the offset voltage of the analog output signal based on a voltage value of the digital signal converted immediately before by the A/D converter, wherein
the control unit compares a third sensor voltage based on the digital signal obtained by a previous A/D conversion with a fourth sensor voltage based on the digital signal obtained by a current A/D conversion, and when an amount of change from the third sensor voltage to the fourth sensor voltage is less than a first threshold, sets a third gain of the analog output signal to a value larger than a previous gain, and when the amount of change exceeds a second threshold, sets the third gain of the analog output signal to a value smaller than the previous gain.

4. The circuit device according to claim 3, wherein the control unit sets a third offset voltage of the analog output signal based on the third sensor voltage based on the digital signal obtained by the previous A/D conversion, and the fourth sensor voltage based on the digital signal obtained by the current A/D conversion.

5. The circuit device according to claim 3, wherein
the A/D converter outputs information on an occurrence
  of overflow and/or underflow in the A/D conversion to
  the control unit together with the digital signal, and
the control unit
  calculates the fourth sensor voltage as an upper limit
    value of a measurement range of the A/D converter
    when an overflow occurs in the A/D conversion,
  calculates the fourth sensor voltage as a lower limit
    value of the measurement range of the A/D converter
    when an underflow occurs in the A/D conversion,
    and
  sets a gain and offset voltage in a next A/D conversion
    to initial values when an overflow or underflow
    occurs in the A/D conversion.

* * * * *